(12) United States Patent
Fong et al.

(10) Patent No.: US 6,404,839 B1
(45) Date of Patent: Jun. 11, 2002

(54) SELECTABLE CLOCK DIVIDER CIRCUIT WITH A 50% DUTY CYCLE CLOCK

(75) Inventors: Wai Fong, San Jose; Jyh-Ming Jong, Saratoga, both of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/797,033

(22) Filed: Feb. 28, 2001

(51) Int. Cl.⁷ ............................................... H03K 21/00
(52) U.S. Cl. .............................. 377/47; 377/48; 377/80; 377/8; 327/115; 327/175
(58) Field of Search .............................. 377/47, 48, 81, 377/80; 327/115, 175

(56) References Cited

U.S. PATENT DOCUMENTS

| | | | | |
|---|---|---|---|---|
| 5,914,996 A | * | 6/1999 | Huang | 377/39 |
| 6,061,418 A | * | 5/2000 | Hassoun | 377/47 |
| 6,121,801 A | * | 9/2000 | Lee | 377/48 |

* cited by examiner

Primary Examiner—Margaret R. Wambach
(74) Attorney, Agent, or Firm—Conley, Rose & Tayon, PC; B. Noël Kivlin (57) ABSTRACT

A clock divider circuit having a fifty per cent duty cycle and multiple integer ratios for dividing an input clock signal. In one embodiment, a clock divider circuit may include a chain of serially-coupled flip-flops. The chain may include at least a first and a second flip-flop, both of which may be triggered by a first edge of an input clock signal. A third flip-flop, coupled to (but not part of) the chain may be configured to be triggered by a second edge of the input clock signal. The third flip-flop may be coupled to an output circuit. In addition to receiving the output signal from the third flip-flop, the output circuit may also receive signals from the chain of serially-coupled flip-flops. The output circuit may drive a second clock signal, which may be produced by dividing the first clock signal based upon the signals it receives. The first clock signal may be divided by an even or an odd integer ratio, or may be divided by an integer ratio (e.g. 2.5), although clock signals produced based on a decimal ratio may have a duty cycle that is not fifty per cent.

26 Claims, 6 Drawing Sheets

SELECTABLE CLOCK DIVIDER CIRCUIT WITH A 50% DUTY CYCLE CLOCK

BACKGROUND OF THE INVENTION

1. Field of the Invention

This invention relates to digital circuits, and more particularly, sequential digital circuits with multiple clock signals.

2. Description of the Related Art

Computers and other electronic systems often times require multiple clock signals for various circuits within their respective systems. In some cases, multiple clock signals may be produced from a single clock signal. One method of producing is to use a phase-locked loop (PLL). A PLL circuit (sometimes referred to as a digital locked loop, or DLL, for clock signal circuits) may receive a clock signal as an input, and produce one or more output clock signals. The frequency of the output clock signals may be a multiple of the input clock signal. Another method of producing multiple clock signals is to use a clock divider circuit. A clock divider circuit may be configured to receive an input clock signal and produce an output clock signal of a lower frequency. The output clock signal may be produced by dividing the input clock signal by a predetermined ratio. A typical clock divider circuit may include several flip-flop circuits, and may be able to divide an input clock signal by one of several even-integer ratios (e.g. 2, 4, 6, etc.).

One problem with many traditional clock circuits relates to their duty cycle. Many clock signals produced by traditional clock circuits do not have a fifty per cent duty cycle (i.e. the signal shape is asymmetrical). This may be less of a concern for low frequency systems and/or systems which use only one clock edge for triggering devices. However, some higher frequency systems may trigger some devices using the positive edge of the clock signal, while triggering other devices using the negative edge. In such systems, it may be critical for the clock signal to have a 50% duty cycle. For example, a clock signal with a 2 ns period and a 50% duty cycle, devices triggering on either clock edge have 1 ns to complete operations. However, if the clock signal is asymmetrical, have a duty cycle of 40%–60%, then devices triggering off of one clock edge may have less time to complete operations than devices triggering off the opposite clock edge. This may have a limiting effect when attempting to design systems that will utilize both clock edges for triggering devices.

Many clock divider circuits are configured primarily for dividing an input clock signal by an even-integer ratio (e.g. 2, 4, 6, etc.), as it is considered easier than dividing by an odd-integer ratio. Clock divider circuits that divide by odd-integer ratios do exist. However, these circuits are typically unable to achieve a duty cycle of 50%. Such clock circuits may be unsuitable for systems utilizing both clock edges, or where a 50% duty cycle is critical for other reasons.

SUMMARY OF THE INVENTION

The problems outlined above may in large part be solved by a clock divider circuit as described herein. In one embodiment, a clock divider circuit may include a chain of serially-coupled flip-flops. The chain may include at least a first and a second flip-flop, both of which may be triggered by a first edge of an input clock signal. A third flip-flop, coupled to (but not part of) the chain may be configured to be triggered by a second edge of the input clock signal. The third flip-flop may be coupled to an output circuit. In addition to receiving the output signal from the third flip-flop, the output circuit may also receive signals from the chain of serially-coupled flip-flops. The output circuit may drive a second clock signal, which may be produced by dividing the first clock signal based upon the signals it receives.

In one embodiment, the second clock signal may be produced by dividing the first clock signal by a predetermined ratio. The ratio by which the first clock signal is divided may be an even or odd integer, or may be a decimal ratio (e.g. 2.5). The ratio by which the first clock signal is to be divided may be determined by a selector circuit. In one embodiment, the selector circuit may be a multiplexer. The multiplexer may be configured to receive one or more selector inputs. The state of these selector inputs may determine the ratio by which the input clock signal is divided. In various embodiments, the state of the inputs to the multiplexer may be changed during the operation of the clock divider, thereby changing the ratio by which the first clock signal is divided and thus the frequency of the second clock signal.

The clock divider may be configured to provide an output clock signal that has a fifty per cent duty cycle. The input clock signal may have a fifty per cent duty cycle as well. Thus, various systems which employ the clock divider circuit may use either the positive or negative clock edge for triggering various devices within the system.

Thus, in various embodiments, the clock divider circuit may advantageously produce an output clock signal by dividing an input clock signal by a predetermined ratio. The ratio may be selectable, and may be an odd integer, an even integer, or a decimal ratio (e.g. 2.5). It should be noted that, in some embodiments, clock signals produced by dividing by a decimal ratio may not have a 50% duty cycle. The selection of the ratio by which to divide the input clock signal may be changed during operation of the clock divider circuit. The output clock signal may have a fifty per cent duty cycle, which may allow various devices in a system to be triggered by either the positive or negative edge of the output clock signal. The clock driver may be useful in computer systems that may require multiple clock signals.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 1A:
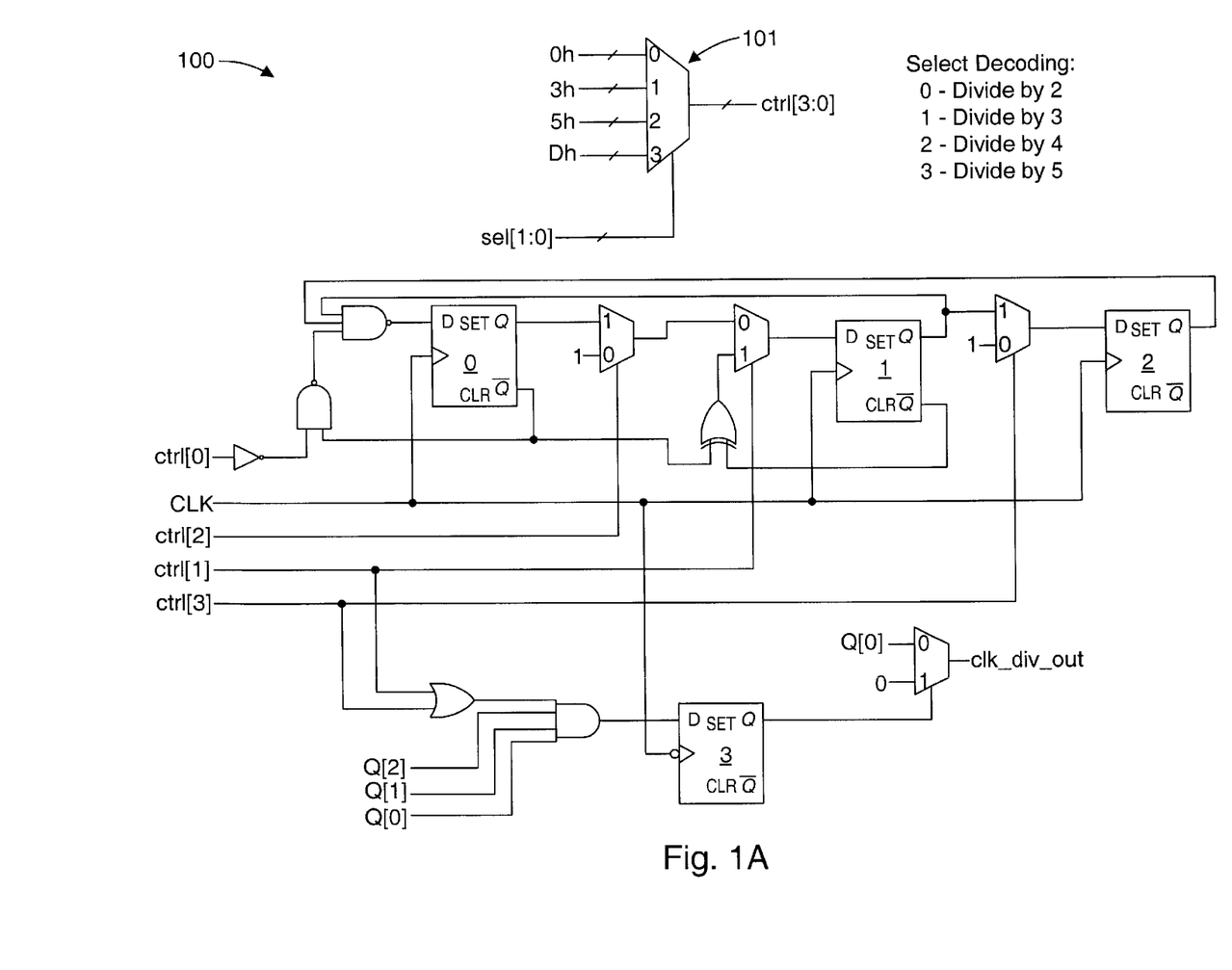
FIG. 1A is a schematic diagram of one embodiment of a clock divider circuit, which is selectable for dividing a clock signal by 2, 3, 4, or 5.

Turning now to FIG. 1A, a schematic diagram of one embodiment of a clock divider circuit, which is selectable for dividing a clock signal by 2, 3, 4, or 5 is shown. Clock divider circuit 100 includes a selector circuit 101, and a plurality of flip-flops, 0–3. Flip-flops 0–3 are D-flip-flops in this embodiment. Other embodiments utilizing other types of flip-flops (JK, RS, T, etc.) are possible and contemplated. In the embodiment shown, flip-flops 0–2 may be serially coupled. Flip-flop 3 may be coupled to (but not part of) the chain of flip-flops 0–2. The embodiment shown may be easily scalable to include additional flip-flops, and thus the ability to divide the input clock signal by more ratios than shown in this particular example.

Clock divider circuit 100 may be configured to receive a plurality of control inputs. These control inputs may be used to select a ratio by which the input clock signal is to be divided. In the embodiment shown, the control inputs are labeled ctrl[0], ctrl[1], ctrl[2], and ctrl[3]. These inputs may initially be received by clock divider circuit 100 through selector circuit 101. Selector circuit 101 may be configured to select one of the four 4-bit inputs, thereby selecting the ratio by which the input clock signal is to be divided. Each 4-bit input may be a control vector comprising the four control inputs, ctrl[0] through ctrl[3], and may represent a ratio for dividing the clock signal. The ratio may be an odd or even integer value, and some embodiments may include decimal ratios (e.g. 2.5), although clock signals produced based on a decimal ratio may not have a 50% duty cycle. In the embodiment shown, hexadecimal notation is used to represent the control inputs. For example, if the select inputs are set for 3 (select 1=1, select 0=1), then ctrl[3:0] will be 1101, or hexadecimal D. Each bit of the control vector may be driven to one or more components in clock divider circuit, thereby controlling the circuit to divide an input clock signal by the selected ratio. In some embodiments, a different ratio may be selected during operation of the circuit.

Each flip-flop in the circuit may be configured to receive a clock signal. Flip-flops 0–2 may be configured to be triggered on a first edge of the clock signal (in this embodiment, the rising edge), while flip-flop 3 may be configured to be triggered on a second (falling) edge. Triggering flip-flops in the serially coupled chain (flip-flops 0–2) on a first clock edge while triggering flip-flop 3, which is not part of the chain, on a second clock edge may allow clock divider circuit 100 to divide the input clock signal by odd ratios as well as even ratios. Some embodiments may trigger the flip-flops of the serially-coupled chain with the falling edge of the input clock signal, while triggering the flip-flop 3 (which is not part of the chain) with the rising edge.

In the embodiment shown, the output of clock divider circuit 100 may be dependent upon the output of flip-flop 3. Flip-flop 3 may be coupled to an output circuit, such as the 2-1 multiplexer shown in this embodiment. The select input to the multiplexer may be the output of flip-flop 3, and may be used to select either the output of a flip-flop in the serial chain, such as flip-flop 0 (Q[0]), or a hardwired logic zero. Alternate embodiments utilizing other types of output circuitry are possible and contemplated.

Flip-flop 3 may also be coupled to an input circuit. In the embodiment shown, the input circuit may be a combinational logic circuit including a 2-input OR gate and a 4-input AND gate. This logic may be different in other embodiments. The two-input OR gate in this embodiment is coupled to control inputs ctrl[1] and ctrl[3], while the output of the OR gate forms one of the inputs to the AND gate. The other three inputs to the AND gate are Q[0], Q[1], and Q[2], the outputs from flip-flops 0, 1, and 2, respectively. The state of the input signal to flip-flop 3 may be dependent upon the combination of inputs to the logic gates of the input circuit.

In the serial chain of flip-flops (flip-flops 0–2), various logic devices may be used to couple the flip-flops together. In the embodiment shown, various logic gates and multiplexers are used to couple flip-flops 0–2 to each other. These logic devices may include as inputs the control inputs previously mentioned. These control inputs may play a part in determining the output state of each flip-flop within the chain during operation of the clock divider circuit.

Figure 1B:
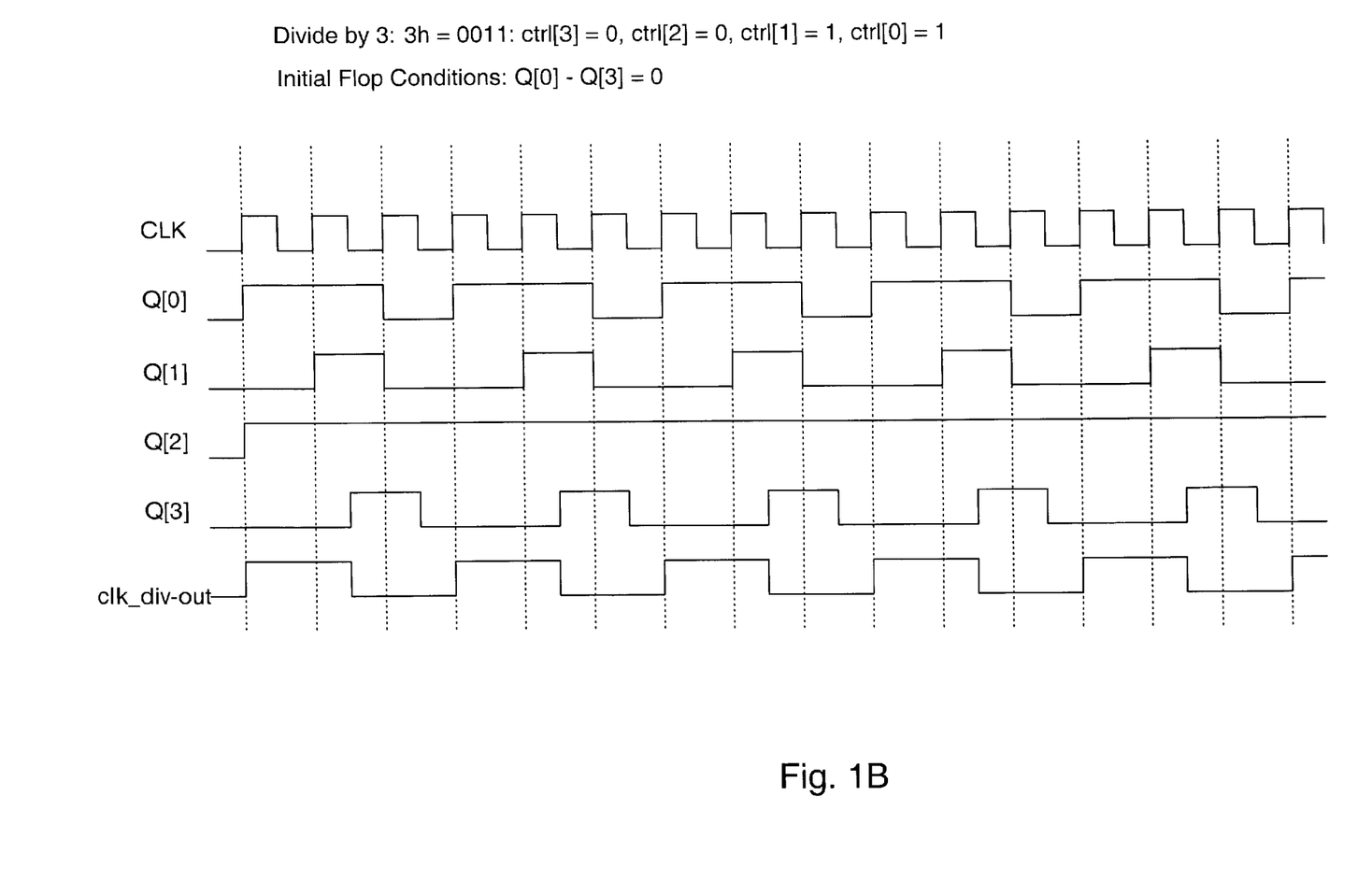
FIG. 1B is a timing diagram illustrating the operation of the clock divider circuit shown in FIG. 1A.

Moving now to FIG. 1B, a timing diagram illustrating the operation of the clock divider circuit shown in FIG. 1A is shown. In this example, clock divider circuit 100 of FIG. 1A is set to divide the clock signal (CLK) by 3. Thus, selector circuit 101 may receive select inputs of sel[1]=0 and sel[0]= 1. This may allow the 4-bit control vector 3h (i.e. binary 0011) to propagate through selector circuit 101, thus setting the control inputs as follows: ctrl[3]=0, ctrl[2]=0, ctrl[1]=1, and ctrl[0]=1. In the embodiment shown in FIG. 1A, ctrl[0] may be driven to an inverter at the input of flip-flop 0. The output of the inverter may be connected to the input of a 2-input NAND gate, as shown in the drawing. Since ctrl[0] is set to a logic 1 in this example, the output of the inverter is a logic 0, thus ensuring the output of the 2-input NAND gate will remain a logic 1, which may be driven to an input of the 3-input NAND gate. The remaining control signals may each act individually as a select input for a 2-to-1 multiplexer. In this example, ctrl[1], as a logic 1, may cause the multiplexer to which it is driven to select the output of an exclusive-OR gate to propagate to the input of flip-flop 1. Ctrl[2], set to a logic 0, may cause a logic 1 to propagate through (a logic 1 is hardwired to the select 0 input). Ctrl[3] (set to a logic 0) may also allow a logic 1 to propagate to the input of flip-flop 2. The ctrl[1] and ctrl[3] inputs may also be driven to an OR gate of the input circuit. Since ctrl[1] is a logic 1 in this example, the output of the OR gate will be a logic 1, which is driven to the input of the 4-input AND gate shown in the drawing. The three remaining inputs to this AND gate are the outputs of flip-flops 0–3, which may change states during the operation of clock divider circuit 100.

The operation of clock divider circuit may begin with the each of the flip-flops in a reset state (i.e. output of each flip-flop is a logic 0). Since ctrl[3] is set to a logic 0 in this example, the hardwired logic 1 is selected by the multiplexer to which ctrl[3] is driven, and thus, the output of flip-flop 2 (Q[2]) becomes a logic 1 on the rising edge of the first clock cycle, and may remain so for the duration of this specific example. Q[2] is coupled to the 3-input NAND at the input of flip-flop 0, as is the output of flip-flop 1, Q[1]. Since Q[1] is initially a logic 0, the output of the 3-input NAND gate, and thus the input to flip-flop 0 is initially a logic 1. Thus, Q[0] may also become a logic 1 at the first rising edge of the clock signal, while the complement of Q[0] may become a logic 0. Since the initial condition of Q[1] is a logic 0, it's complement is initially a logic 1. Following the change of state of Q[0] on the first clock edge, the output of the exclusive OR gate may change, since its two inputs are now complements of each other. This may cause Q[1] to change to a logic 1 on the rising edge of the next clock cycle. When Q[1] changes to a logic 1, the three inputs to the NAND gate will all be a logic 1, and thus the NAND gate output will be a logic 0. Similarly, both inputs to the exclusive OR gate will be logic 0's. This may cause the state of both Q[0] and Q[1] to change to a logic 0 on the rising edge of the next clock cycle. This relationship between Q[0] and Q[1] may repeat itself throughout the operation of the clock divider circuit of FIG. 1A.

As previously stated, the output of the OR gate in the input circuit may be held to a logic 1 by the virtue of the logic 1 input (ctrl[1]). Similarly, Q[2] may be held to a logic 1 following the rising edge of the first clock cycle. Thus, the output of the 4-input AND gate may become a logic 1 when both Q[0] and Q[1] are both a logic 1. This combination of inputs may occur, in this example, following the rising edge of the second clock cycle, and may repeat itself on the rising edge of every other clock cycle. When the output of the 4-input AND gate is a logic 1, the output of flip-flop 3 (Q[3]) may become a logic 1 at the negative edge of the clock cycle in which both Q[0] and Q[1] are logic 1. This may cause the output circuit, a 2-1 multiplexer, to select a hardwired logic 0, as shown in FIG. 1A. The output of the clock divider circuit in FIG. 1A, clk_div_out, may then be a logic 0. When Q[3] is a logic 0, the output of this embodiment of the clock divider circuit may follow Q[0], the output of flip-flop 0. This combination of inputs and flipflop sequences may produce a clock cycle that has a period that is 3 times that of the original clock signal CLK.

Figure 2A:
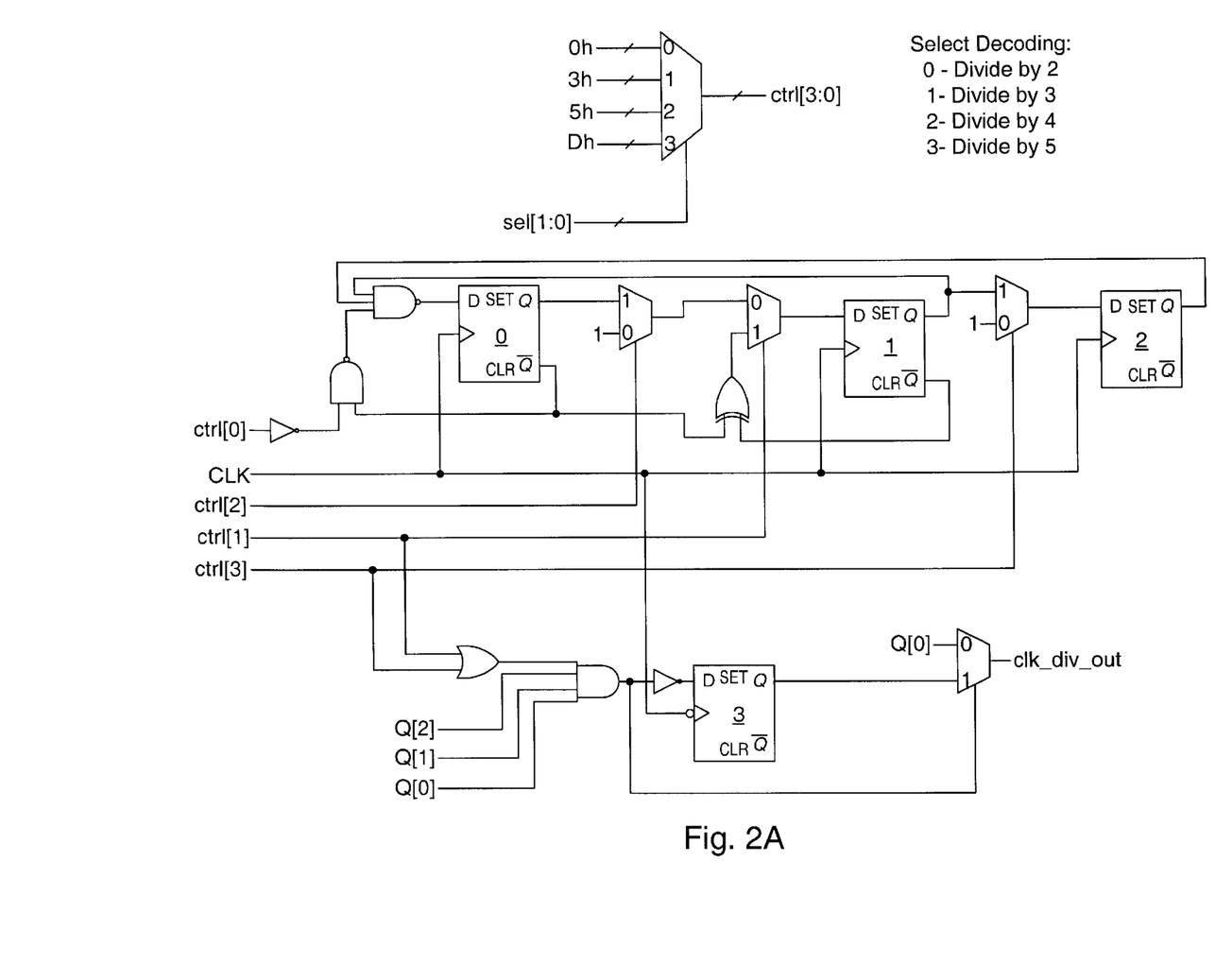
FIG. 2A is a schematic diagram of an alternate embodiment of a clock divider circuit which is selectable for dividing a clock signal by 2, 3, 4, or 5.

Turning now to FIG. 2A, a schematic diagram of an alternate embodiment of a clock divider circuit which is selectable for dividing a clock signal by 2, 3, 4, or 5. The embodiment shown is similar to that of FIG. 1A, with a different configuration for the input and output circuitry. In the embodiment shown, an inverter may be placed between the output of the AND gate and the input to flip-flop 3. A signal line coupling the non-inverted output of the AND gate to the select input of the 2-1 multiplexer serving as the output circuit may also be present. The output of flip-flop 3, Q[3], may be coupled to the output circuit as one of the two selectable inputs to the 2-1 multiplexer. Q[3] may propagate through the multiplexer when the output of the AND gate is a logic 1. Otherwise, the output of the multiplexer, clk_div_out, may follow Q[0]. In this particular configuration, it may be easier to achieve a 50% duty cycle, since both multiplexer data inputs come from flip-flops in the clock divider circuit.

Figure 2B:
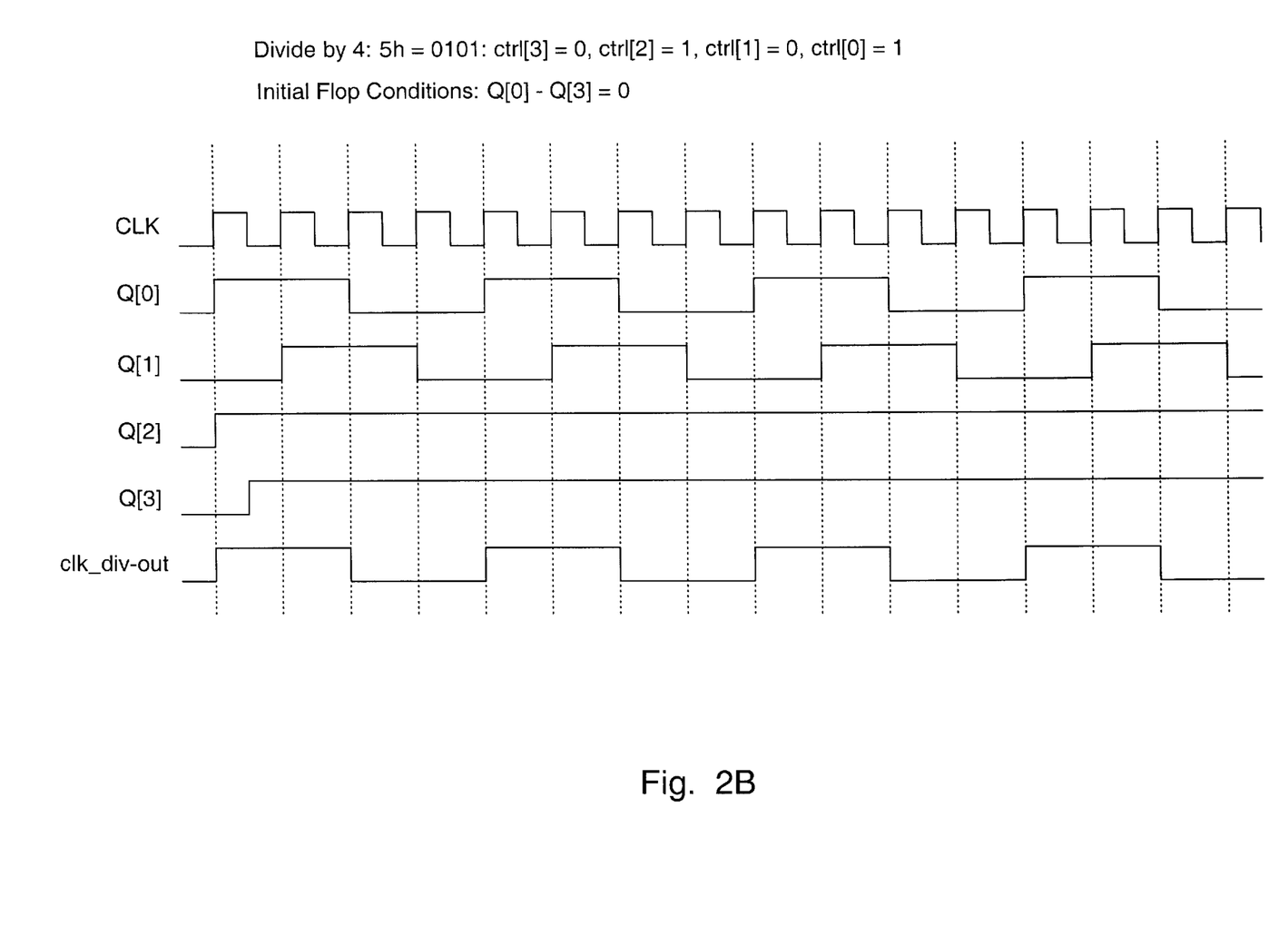
FIG. 2B is a timing diagram illustrating the operation of the clock divider circuit shown in FIG. 2A.

FIG. 2B is a timing diagram illustrating the operation of the clock divider circuit shown in FIG. 2A. In this example, the control inputs are set to divide the clock signal CLK by 4 (ctrl[3]=0, ctrl[2]=1, ctrl[1]=0, and ctrl[1]=1). This combination of control inputs may result in the output of the AND gate (of the input circuit) being driven to a logic 0, thereby causing the multiplexer output circuit to allow Q[0] to propagate through the multiplexer. Thus, the output of the clock divider circuit, clk_div_out will be the same state as Q[0] for this example. This combination of inputs, as well as the flip-flop flop sequences, may result in the clock divider circuit of FIG. 2A producing an output clock signal with a period 4 times that of the input clock signal.

Figure 3A:
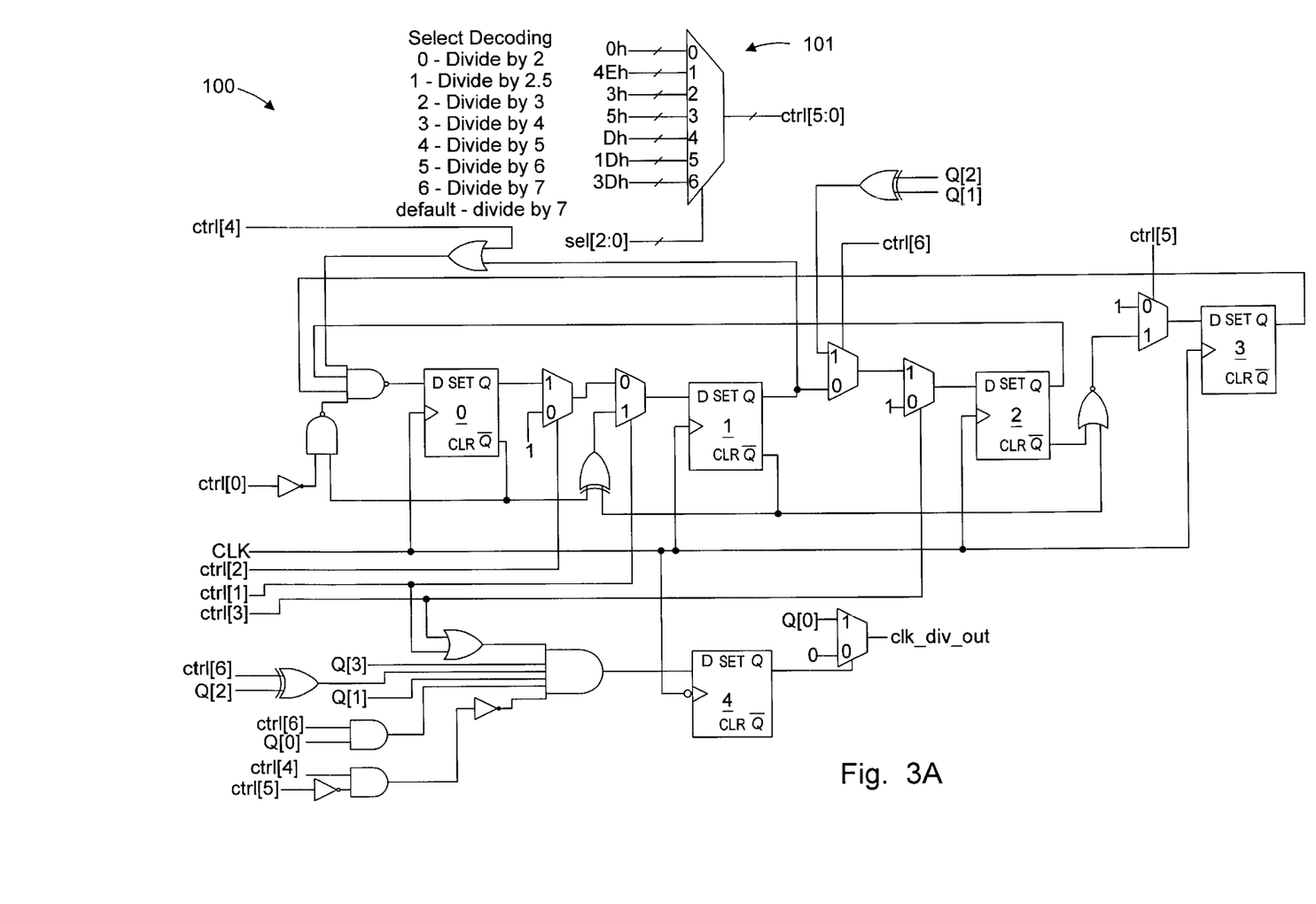
FIG. 3A is a schematic diagram of one embodiment of a clock divider circuit which is selectable for dividing a clock signal by 2, 2.5, 3, 4, 6, or 7.

Moving now to FIG. 3A, a schematic diagram of one embodiment of a clock divider circuit which is selectable for dividing a clock signal by 2, 2.5, 3, 4, 6, or 7 is shown. In this embodiment, clock divider circuit 100 may include a select circuit that is a multiplexer configured to receive a plurality of multi-bit inputs, expressed here as hexadecimal codes, with only the six least-significant bits used. The binary representation of these hexadecimal codes comprise the control inputs (ctrl[6:0]) to clock divider circuit 100.

Clock divider circuit 100, in this embodiment, includes a chain of four serially coupled flip-flops, flip-flops 0–3. A plurality of logic circuits, including various logic gates and multiplexers is used to couple the flip-flops of the chain. Also included in the clock divider circuit is an input circuit including a plurality of logic gates and inverters. The input circuit may be coupled to the input of flip-flop 4, which is not part of the serially coupled chain, by the output of the 6-input AND gate shown in the drawing. A 2-1 multiplexer serves as an output circuit in this embodiment. The output clock signal, clk_div_out, may be dependent upon either the output of flip-flop 0, or may be a hardwired logic 0, dependent upon the output flip-flop 4.

Figure 3B:
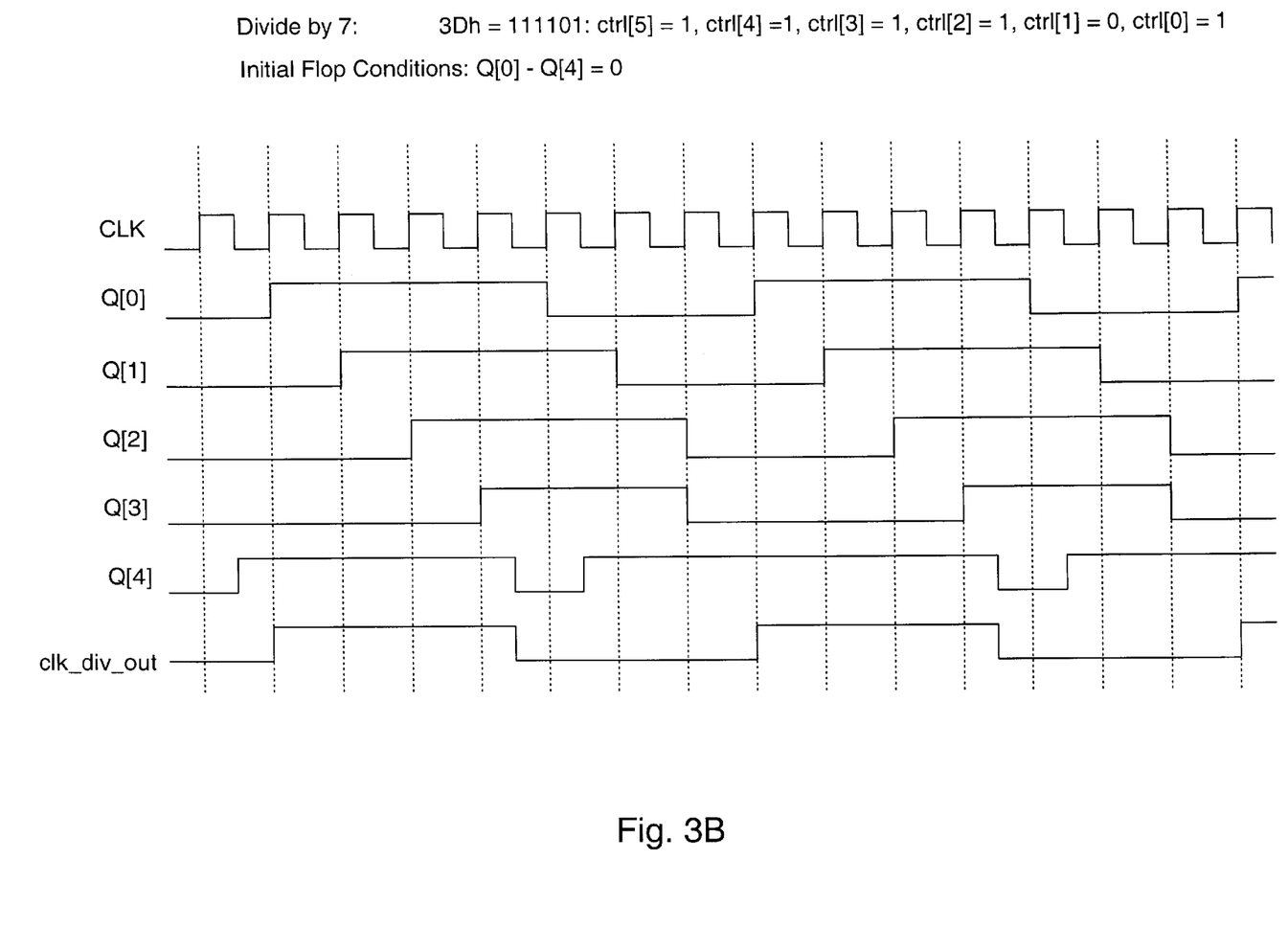
FIG. 3B is a timing diagram illustrating the operation of the clock divider circuit shown in FIG. 3A.

Turning now to FIG. 3B, a timing diagram illustrating the operation of the clock divider circuit shown in FIG. 3A is shown. In this particular example, clock divider circuit 100 of FIG. 3A may be configured for dividing an input clock signal (CLK) by a factor of 7. As can be seen in the diagram, the output clock signal (clk_div_out) has a period that is 7 times that of the input clock signal.

A wide variety of various embodiments of the clock divider circuit are possible and contemplated. There is no theoretical limit to the number of flip-flops which may be used in any given embodiment, nor does any theoretical limit exist on the number or value of the ratios by which an input clock signal may be divided.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scoped of the present invention as defined be the appended claims.

What is claimed is:

1. A clock divider comprising:
   a chain of serially coupled flip-flops including at least a first flip-flop and a second flip-flop, wherein said first flip-flop and said second flip-flop are triggered by a first clock edge of an input clock signal;
   a third flip-flop coupled to said chain of serially coupled flip-flops, wherein said third flip-flop is triggered by a second clock edge of said input clock signal; and
   a circuit coupled to said third flip-flop, wherein said third flip-flop is configured to receive an input signal dependent upon a combination of inputs to said circuit.

2. The clock divider as recited in claim 1, wherein an output clock signal of said clock divider is dependent upon an output signal from said third flip-flop.

3. The clock divider as recited in claim 2, further comprising and output circuit, said output circuit configured to receive said output signal from said third flip-flop and at least one signal from said chain of serially-coupled flip-flops.

4. The clock divider as recited in claim 3, wherein said output circuit is configured to drive an output clock signal, said output clock signal produced by dividing said input clock signal by a predetermined ratio.

5. The clock divider as recited in claim 4, wherein said predetermined ratio is selected from a plurality of ratios, said plurality of ratios including both odd and even integer values.

6. The clock divider as recited in claim 5, wherein said clock divider includes a selector circuit for selecting said predetermined ratio.

7. The clock divider as recited in claim 6, wherein said input clock signal and said output clock signal each have a fifty per cent duty cycle.

8. The clock divider as recited in claim 1, wherein said circuit is a combinational logic circuit.

9. The clock divider as recited in claim 1, wherein said flip-flops are D-flip-flops.

10. The clock divider as recited in claim 1, wherein said first clock edge is a positive edge and said second clock edge is a negative edge.

11. The clock divider as recited in claim 1, wherein said first clock edge is a negative edge, and said second clock edge is a positive edge.

12. The clock divider as recited in claim 1, wherein said circuit is configured to receive one or more input signals from a source external to said clock divider.

13. The clock divider as recited in claim 1, wherein said input circuit is configured to receive one or more input signals from said chain of serially-coupled flip-flops.

14. A computer system comprising:
 a clock divider, said clock divider including:
  a chain of serially coupled flip-flops including at least a first flip-flop and a second flip-flop, wherein said first flip-flop and said second flip-flop are triggered by a first clock edge of an input clock signal;
  a third flip-flop coupled to said chain of serially coupled flip-flops, wherein said third flip-flop is triggered by a second clock edge of said input clock signal; and
  a circuit coupled to said third flip-flop, wherein said third flip-flop is configured to receive an input signal dependent upon a combination of inputs to said circuit.

15. The computer system as recited in claim 14, wherein an output clock signal of said clock divider is dependent upon an output signal from said third flip-flop.

16. The computer system as recited in claim 15 further comprising and output circuit, said output circuit configured to receive said output signal from said third flip-flop.

17. The computer system as recited in claim 16, wherein said output circuit is configured to drive an output clock signal, said output clock signal produced by dividing said input clock signal by a predetermined ratio.

18. The computer system as recited in claim 17, wherein said predetermined ratio is selected from a plurality of ratios, said plurality of ratios including both odd and even integer values.

19. The computer system as recited in claim 18, wherein said clock divider includes a selector circuit for selecting said predetermined ratio.

20. The computer system as recited in claim 19, wherein said input clock signal and said output clock signal each have a fifty per cent duty cycle.

21. The computer system as recited in claim 14, wherein said circuit is a combinational logic circuit.

22. The computer system as recited in claim 14, wherein said flip-flops are D-flip-flops.

23. The computer system as recited in claim 14, wherein said first clock edge is a positive edge and said second clock edge is a negative edge.

24. The computer system as recited in claim 14, wherein said first clock edge is a negative edge, and said second clock edge is a positive edge.

25. The computer system as recited in claim 14, wherein said circuit is configured to receive one or more input signals from a source external to said clock divider.

26. The computer system as recited in claim 14, wherein said circuit is configured to receive one or more input signals from said chain of serially-coupled flip-flops.

* * * * *